July 21, 1959 E. K. HOWELL 2,896,169

AUTOMATIC FREQUENCY CONTROL SYSTEM WITH
A TWO-SPEED FREQUENCY SWEEP

Filed Oct. 24, 1955

INVENTOR:
E. KEITH HOWELL,
BY Donald N. Timbie
HIS ATTORNEY.

United States Patent Office 2,896,169

Patented July 21, 1959

2,896,169

AUTOMATIC FREQUENCY CONTROL SYSTEM WITH A TWO-SPEED FREQUENCY SWEEP

Edward Keith Howell, Nahant, Mass., assignor to General Electric Company, a corporation of New York Application October 24, 1955, Serial No. 542,155

9 Claims. (Cl. 331—4)

This invention relates to an improved automatic frequency control system which includes a means for causing a local oscillator to sweep over a band of frequencies at a relatively high rate until synchronism is approached and continues the sweep at a relatively slow rate until synchronism is achieved.

In order to increase the effective pull-in range of an automatic frequency control system without increasing the noise bandwidth or loop gain of the system, it has been proposed to provide a means to sweep the local oscillator over a band of frequencies including that of a synchronizing signal until synchronism has been achieved. In such a system, it has been found necessary to provide a comparatively slow sweep rate, or rate of change of frequency, of the local oscillator in order that sweeping will not be carried out at a rate whereby the AFC loop will not be able to bring the local oscillator into synchronism and hold it there.

Therefore, it is an object of this invention to provide an improved automatic frequency control system wherein a local oscillator can be swept at a relatively high rate and which provides for reducing the sweeping rate as synchronism is approached so that the AFC loop may hold the system in synchronism.

It is another object of this invention to provide a novel automatic frequency control system which includes an automatic frequency control loop having a relatively narrow band-pass so as to present good immunity to noise error possibilities and which also includes a means for increasing the pull-in range and decreasing the pull-in time.

It is still another object of this invention to provide a novel automatic frequency control system which includes a means to cause a local oscillator to sweep over a band of frequencies at two different rates and which ceases its action when the oscillator is close to synchronism, and an automatic frequency control loop to bring the oscillator into synchronism and maintain it in synchronism.

Briefly, the objects of this invention are achieved in one form by the provision of an automatic frequency control system which includes a conventional AFC loop which functions substantially in the manner well known in the art. A second loop is provided with a sweep oscillator, the output of which is coupled to the control network of the AFC loop whereby, when the oscillator is operating, a sawtooth voltage generated thereby will cause the local oscillator in the AFC loop to sweep over a range of frequencies centered about that of the signal with which the local oscillator is to be synchronized. Means in the sweeping loop develops a control signal which is applied to control devices for the sweep oscillator to determine its operation. Coupled between the means developing the control signal and the sweep oscillator control means, I provide a device to vary the nature of the control signal whereby the output of the sweep oscillator is retarded as the local oscillator approaches synchronism. This arrangement provides a relatively high initial sweep rate which is reduced as the oscillator approaches synchronism permitting the AFC loop to take over and hold the oscillator in synchronism.

The features of my invention which I believe to be novel are set forth with particularity in the appended claims. My invention itself, however, both to its organization and method of operation together with further objects and advantages thereof, may be best understood by reference to the following description taken in connection with the accompanying drawing in which:

Figure 1:
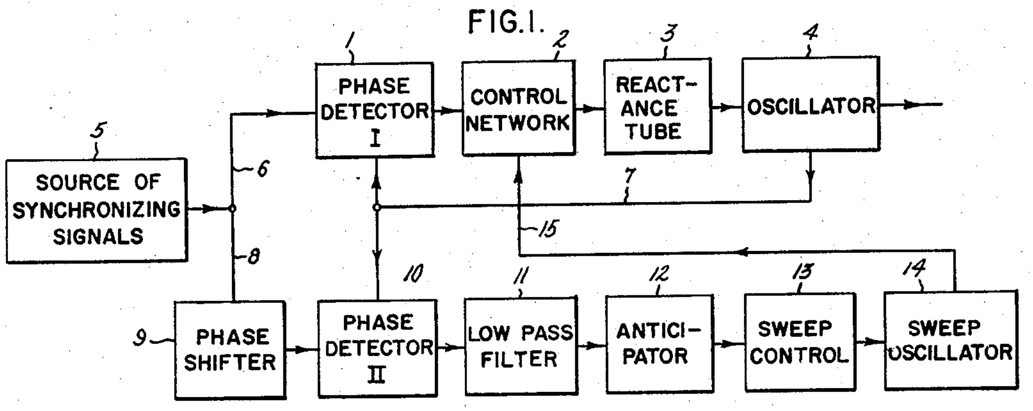
Figure 1 is a block diagram of a circuit incorporating my invention.

Referring now to Figure 1 of the drawing, it may be seen that the circuit includes a first phase detector 1. The output of the phase detector 1 is coupled to a control network 2 which in turn is coupled to a reactance tube 3, the output of which determines the phase and the frequency of a local oscillator 4. A source of synchronizing signals 5, which signals may take the form of a continuous wave, a periodic burst, or pulse, is fed to the phase detector 1 over a conductor 6. A signal representative of the output of the local oscillator 4 is coupled to the phase detector 1 over a conductor 7 in the manner well-known in the art. This portion of the circuit describes the well-known AFC loop, the operation of which is understood by those skilled in the art. The devices for carrying out this portion of my invention may take numerous forms and specific devices are shown only for purposes of illustration.

The synchronizing signals from the source 5 are also coupled via a conductor 8 to a 90° phase-shifting network 9 and are coupled to a second phase detector 10, which also receives the signal representative of the output of the local oscillator 4 over the conductor 7. By virtue of the action of the phase-shifting network 9, the phase relationship of the synchronizing signal to the oscillator output signal received at the phase detector 1 differs 90° from the phase relationship between the same two signals applied to the phase detector 10. It is obvious that the phase-shifting network may be located as illustrated in the drawing, or interposed in either, or both, the conductor 6 or 7 leading to the phase detectors 1 or 10. Alternatively, it may comprise a combination of phase-shifting networks, advancing and/or retarding either, or both, of the two signals at appropriate places in the circuit in order to obtain the 90° difference between the phase relationship of each of the two signals at each of the two phase detectors.

A control signal developed by the phase detector 10 is coupled through a low-pass filter to an anticipator 12 which will be described in greater detail hereinafter. The output of the anticipator 12 is applied to a sweep control 13, which is effective to permit operation of the sweep oscillator 14 at a rate depending on the signal coupled to it through the anticipator 12, or to halt its action altogether. The output of the sweep oscillator 14 is coupled to the control network 2 and the varying voltage character thereof is effective to change the frequency of the oscillator in accordance with the variations of the conductance in the reactance tube 3 in the manner well known in the art.

In the operation of my device, when a control signal is developed by the phase detector 10 indicating that the local oscillator is not in frequency synchronism with the synchronizing signal, the sweep control 13 will permit the sweep oscillator 14 to develop a varying voltage output which will cause the local oscillator to sweep over a band of frequencies. The values of the components are selected to cause this band of frequencies to include, or preferably, to be centered about the frequency of the synchronizing signal. As the local oscillator frequency approaches that of the synchronizing signal, a first control signal will be developed by the cooperation of the phase detector 10, low-pass filter 11 and anticipator 12, as will be explained in greater detail hereinafter. The first control signal will cause the sweep control 13 to retard the action of the sweep oscillator 14, thereby reducing the rate of change of frequency of the local oscillator 4. At this reduced sweep speed, the control signal produced by the phase detector 1 will be effective to complete the synchronizing operation and will function to hold the oscillator in synchronism. At this point a second control signal produced by the second detector 10 will be passed by the low-pass filter 11 and anticipator 12 to the sweep control 13 to halt the action of the sweep oscillator altogether. It is contemplated that the control signals may be of zero, positive or negative potential and, depending upon the manner in which the sweep control is connected, they can either halt or initiate action of the sweep oscillator. It is further contemplated that the sweep control and the sweep oscillator need not be separate elements, as shown, but the sweep control may in fact be incorporated in the oscillator, for example, by the provision of an oscillator having a grid to which a suitable voltage may be applied to prevent oscillations.

Figure 2:
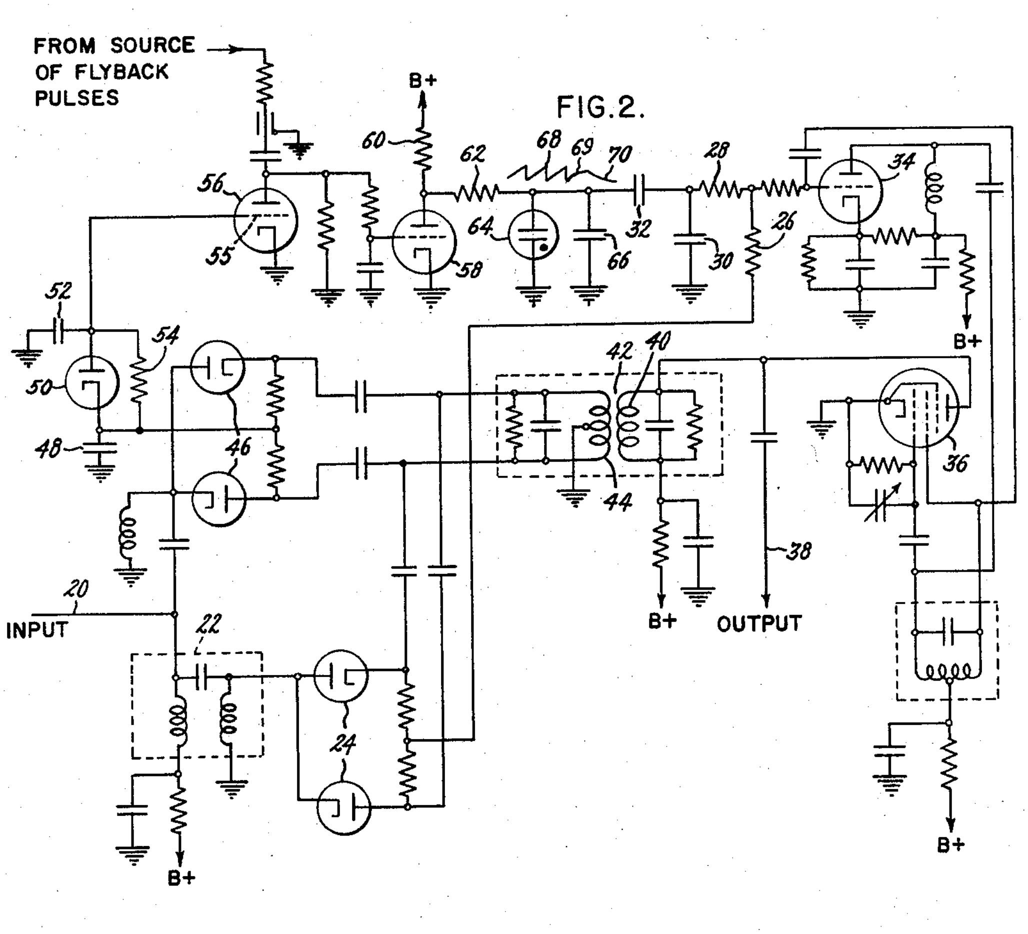
Figure 2 is a schematic diagram of a particular form which my invention may take.

A circuit embodying this invention is illustrated schematically in Figure 2 and the description now refers to this figure. In this form of the invention, I provide a conductor 20 over which the synchronizing signal is supplied. A phase-shifting network 22 receives the synchronizing signal and advances its phase 90° and couples it to the phase detector 24 which forms part of the first component or AFC loop part of the system. The control output of the phase detector 24 is coupled to the control network of the AFC loop which is constituted by the resistors 26 and 28 and capacitive voltage dividers 30 and 32. A reactance tube 34 receives the output of the control network and is effective to control a local oscillator 36 in the manner well known in the art. An output lead 38 is coupled to the primary 40 of an oscillator-transformer 42. A push-pull signal is induced on the secondary 44 of the oscillator-transformer 42 and is applied to the phase detector 24. The control signal for the AFC loop component of the system is developed at this phase detector in accordance with the operation of phase detectors well known in the art. The values of the components in the control network are selected to provide a relatively narrow pass band so as to provide a good immunity to noise disturbances and their accompanying dynamic phase error possibilities.

The second or sweeping component of the system provides, as is pointed out above, a device for causing the local oscillator to sweep over a band of frequencies which may be centered about that of the synchronizing signal. It also includes a means for developing signals controlling the action of the sweep oscillator. In the circuit illustrated in Figure 2, the control signal developing means takes the form of a second phase detector 46 which also has the synchronizing signal coupled to it over the conductor 20. The output of the local oscillator 36 is coupled to the phase detector 46 through the secondary 44 of the oscillator-transformer 42 in push-pull. The output of the phase detector 46 is filtered by the capacitor 48 and applied through the anticipator, which in this form of the invention is a diode 50 with its cathode coupled through the filter 48, to the phase detector 46. A smoothing filter capacitor 52 is connected to the anode side of the diode 50 and is provided with a path to ground through resistor 54, which is of such magnitude as to provide a large discharge time constant as compared to the frequency of the sweep oscillator for a purpose to be brought out hereinafter.

Since the phase shifting in the circuit illustrated is carried out in the signal applied to the first phase detector 24, it operates as a quadrature phase detector when the system is synchronous, while the phase detector 46 operates as an in-phase detector. Thus, the phase detector 46 produces a maximum negative direct-current voltage when the oscillator 36 is synchronized with the synchronizing signal. If the synchronizing signal is not present, the output of the phase detector 46 is zero and, if such a signal is present and the local oscillator 36 is not synchronized therewith, the output of the phase detector 46 is an alternating-current beat frequency representing the difference in frequency between the oscillator and the synchronizing signal. Under the latter condition, it contains no appreciable direct-current signal.

The output of the anticipator is coupled to a grid 55 of a tube 56 which functions as a rectifier, the efficiency of which is controlled by its grid voltage. Positive-going pulses from a suitable source, which in the circuit illustrated may be the flyback pulses from the horizontal deflection transformer of a television receiver, are capacitively coupled to the plate of this tube. When the grid 55 is zero, a large negative direct-current voltage is developed at the plate of the rectifier 56 and is coupled to the grid of a control tube 58. When this voltage is sufficiently negative, it will cut off tht plate current of the control tube 58 and the potential at the plate, which is coupled through the dropping resistor 60 to a source of positive potential, will build up. The plate voltage will be coupled through the resistor 62 to a gas-diode 64 and a capacitor 66. The capacitor 66 will start to charge through the resistors 60, 62 until it reaches the ignition potential of the gas-diode 64, at which point the gas ionizes and the capacitor 66 discharges to the extinction potential of the gas-diode 64. The cycle then repeats forming the sawtooth sweep voltage shown at 68. The sawtooth voltage 68 is applied to the reactance tube through capacitive voltage dividers 30 and 32, and resistor 28 which, as pointed out, is part of the AFC loop control network. The repetition rate of the sawtooth voltage 68 is primarily determined by the effective supply voltage and the time constant of resistor 62 and capacitor 66. The effective supply voltage for the gas-diode is determined by the B+ supply and by the voltage divider formed by the resistor 60 and the tube 58 whose plate resistance (or conductivity) is a function of the potential applied to its grid. The sweep range of the local oscillator 36 is determined by the frequency control slope of the reactance tube 34 and the amplitude of the sawtooth voltage applied to it, and can be chosen to center about the frequency of the signal with which it is to be synchronized.

When the grid of the control tube 58 becomes less negative, as it does when a negative signal is applied to the grid 55 of the rectifier 56 and the resulting loss in negative voltage at the plate of 56 is coupled to the grid of control tube 58, the tube 58 conducts partially and its plate voltage drops below the B+ supply voltage, thus reducing the charging rate on capacitor 66, hence, retarding the sweep repetition rate as shown by the slowly rising curve 69. With the application of a large negative voltage to the grid 55 of rectifier 56, the negative potential at its plate drops to zero, thus removing all bias of tube 58, and permitting full conduction. The resistor 60 is so chosen that under this condition, the plate voltage drops below the ignition potential of the gas-diode 64. The sawtooth oscillations are halted completely at this time and the capacitor 66 discharges through resistor 62 to the value of plate voltage as indicated by the gradually sloping curve 70. The rate of change of this discharge 70 is much less than the rate of charging during the sweeping cycle and is slow enough that the AFC loop, which is now controlling the local oscillator 36, will hold synchronization.

As pointed out above, the phase detector which is operating as an in-phase detector develops a negative direct-current voltage when the local oscillator is in synchronization. This negative voltage is passed by the anticipator diode 50 and, after smoothing by the capacitors 48 and 52, is applied to the grid 55 of the rectifier 56 to halt the action of the sweep oscillator 64 in the manner described in the preceding paragraph. As pointed out above, the RC combination 52, 54 has a large time constant in relation to frequency of the sweep oscillator which frequency is determined by the RC combination 62, 66. Thus, there is a relatively high impedance path through the resistor 54 to the capacitor 52 and, therefore, there is, in the direction of initiating the sweep, a long time constant, and momentary interruption of the synchronizing signal, such as caused by switching or noise burst, will have little tendency to start the sweep oscillator 64. On the other hand, since the internal impedance of the diode 50, for signals of negative polarity, is low in relation to the value of the resistor 54, there is a short time constant in the direction of stopping and retarding the sweep and the control signals for this purpose are developed to prevent the local oscillator 34 from over-riding the synchronizing signal. Should the voltage for stopping the oscillator be of positive polarity, then the diode 50 may be reversed. It is desired to use a relatively high sweep speed, or rate of change of frequency, during the initial sweep of the local oscillator in order to reduce pull-in time. However, if the sweep continues at the relatively high rate as the local oscillator 36 approaches synchronism, the time constant of the AFC loop may be too large to allow it to take control of the local oscillator during the brief period in which the sweep is within the normal pull-in range of the AFC loop. Therefore, I provide the anticipator to slow the sweep as the local oscillator approaches synchronism. The capacitor 48 functions in conjunction with the internal impedance of the phase detector 46 as a low-pass filter which determines the maximum beat or difference frequency at which the sweep rate will begin to decay. That is, as the local oscillator 36 approaches synchronism, the beat frequency output of the phase detector 46 will decrease in frequency and at a predetermined point, the alternating-current output of the low-pass filter 48 will begin to rise in amplitude. This amplitude is then detected by the anticipator diode 50 and is applied in the form of a small negative direct-current signal to the grid 55 of the rectifier 56 to retard the oscillator 64 as described above. At synchronism, the phase detector will be producing its own negative direct-current signal which is large enough to cut off the sweep oscillator 64 and maintain it in this condition. The point at which the difference frequency is passed on to the anticipator detector 50 is determined by the pull-in range of the normal AFC loop. Thus, in a system that will cause the oscillator to sweep over a range of ±7 kc., centered about the frequency of the synchronizing signal, it may be found desirable to slow the sweep at ±1 kc. to permit the AFC loop to take over and hold the system in synchronism.

The system described permits the use of a relatively narrow band AFC system in order to provide good noise immunity. A relatively wide pull-in range is provided by sweeping the oscillator over a wide range until synchronism occurs. The use of the anticipator results in two different sweep rates which decrease the pull-in time. In addition, the anticipator detector improves the noise immunity of the sweep system since it has a short time constant in the direction of disabling the sweep and a long time constant in starting the sweep. Thus, if the synchronizing signal is interrupted by switching or by a large noise burst, the sweep will not be initiated unless the system does not recover synchronization.

While the present invention is described by reference to a particular embodiment thereof, it will be understood that numerous modifications may be made by those skilled in the art without actually departing from the invention. Therefore, the appended claims are to cover all such variations as come within the true spirit and scope of the invention.

What I claim as new and desire to secure by Letters Patent of the United States is:

1. An automatic frequency control system comprising a first phase detector, a local oscillator to be synchronized with a synchronizing signal, local oscillator control means for controlling the phase and frequency of said local oscillator, a circuit connecting the output of said first phase detector to said local oscillator control means, a second phase detector, means coupling a signal representative of the output of said local oscillator and a synchronizing signal to said first and second phase detectors, phase-shifting means coupled between said first and second phase detectors whereby the phase relationship between the two signals at one of said phase detectors will differ 90° from the phase relationship between the same two signals at the other phase detector, a sweep oscillator, a circuit coupling the output of said sweep oscillator to said local oscillator control means whereby the frequency of said local oscillator will vary over a band of frequencies including that of said synchronizing signal when said sweep oscillator is operating, sweep oscillator control means for controlling the operation of said sweep oscillator and effective to cause it to develop a varying voltage signal upon the receipt of a control signal from said second phase detector indicating that the local oscillator is not in synchronism with said synchronizing signal, anticipator means coupling the output of said second phase detector to said sweep oscillator control means to decrease the time rate of change of the varying voltage signal developed by said sweep oscillator to slow down the rate of change of frequency of said local oscillator as synchronism is initially approached.

2. An automatic frequency control system comprising a first phase detector adapted to receive a synchronizing signal, a local oscillator to be synchronized in phase and frequency with said synchronizing signal, local oscillator control means to vary the phase and frequency of said local oscillator, means coupling the output of said first phase detector to said local oscillator control means, a sweep oscillator, the output of said sweep oscillator being coupled to said local oscillator control means, a second phase detector adapted to receive said synchronizing signals, a circuit connecting the output of said local oscillator to said first and second phase detectors, phase-shifting means coupled between said first and second phase detectors whereby said second phase detector will be comparing said synchronizing signal and said signal representative of the output of said local oscillator in quadrature relationship to the comparison being effected by said first phase detector and will produce a unidirectional voltage when synchronism is achieved, a sweep oscillator, the output of said sweep oscillator being coupled to said local oscillator control means, sweep oscillator control means effective upon the recept of said unidirectional voltage to stop said sweep oscillator, a low-pass filter receiving the output of said second phase detector and a rectifier device adapted to pass said unidirectional voltage coupling said low-pass filter to said sweep oscillator control means.

3. In an automatic frequency control system including a first phase detector, a local oscillator and a local oscillator control means, the improvement comprising a sweep oscillator, means coupling the output of said sweep oscillator to the local oscillator control means, a second phase detector coupled to and operating in quadrature relationship to the first phase detector and developing a control signal when the local oscillator is synchronized with a synchronizing signal, sweep oscillator control means to determine the operation of said sweep oscillator and responsive to the receipt of said control signal to stop said sweep oscillator, means coupling said second phase detector to said sweep oscillator to develop a second control signal decreasing the rate of the sweep oscillator as synchronism is initially approached.

4. In an automatic frequency control system including a first phase detector, a local oscillator and a local oscillator control means, the improvement comprising a sweep oscillator, means coupling the output of said sweep oscillator to the local oscillator control means, a second phase detector coupled to and operating in quadrature relationship to the first phase detector and developing a unidirectional signal when the local oscillator is synchronized with a synchronizing signal, sweep oscillator control means coupled to said sweep oscillator and determining the potential applied thereto, a low-pass filter coupled to the output of said second phase detector for passing the beat output signal of said second phase detector developed as the local oscillator approaches synchronism with the synchronizing signal, a unidirectional current-passing device coupling said low-pass filter to said sweep oscillator control means to rectify said beat output and to pass a unidirectional signal developed by said phase detector when said local oscillator is in synchronism with the synchronizing signal whereby said rectified beat output signal will cause the output of said sweep oscillator to be decreased in its rate of change and said unidirectional signal will stop its oscillations.

5. An automatic frequency control system comprising a first component consisting of an automatic frequency control loop including a local oscillator, a second component including a sweep oscillator, the output of said sweep oscillator being coupled to said automatic frequency control loop to cause said local oscillator to vary over a band of frequencies including or centered about that of a synchronizing signal, a sweep oscillator control means to determine the potential applied to said sweep oscillator, a control signal developing device, means for applying a synchronizing signal and a signal representative of the output of said local oscillator to said control signal developing device, whereby said control signal developing device will produce a first control signal as said local oscillator approaches synchronism with said synchronizing signal and a second control signal as synchronism is reached, means coupled between said control signal developing device and said sweep oscillator control means to pass both said first and second control signals whereby said first control signal will cause the sweep oscillator output time rate of change to decrease and said second control signal will halt said sweep oscillator.

6. An automatic frequency control system comprising an automatic frequency control loop including a local oscillator to be synchronized with synchronizing signals and means coupled to said local oscillator for controlling its frequency in accordance with a signal indicative of the phase relationship between the oscillations of said oscillator and the synchronizing signal, a sweep oscillator, means coupling the output of said sweep oscillator to said local oscillator control means, a control signal developing means, sweep oscillator control means, a smoothing filter coupled to said sweep oscillator control means, a pair of parallel paths coupling said control signal developing means to said smoothing filter, one of said paths offering a relatively low impedance path for control signals of a predetermined polarity, and the other of said paths offering a relatively high impedance to all control signals irrespective of polarity.

7. An automatic frequency control system as defined in claim 6 wherein said path offering the relatively low impedance to control signals of a predetermined polarity includes a diode and said path offering said relatively high impedance to all control signals includes a resistive element.

8. An automatic synchronizing system comprising an automatic frequency control loop including a local oscillator that is to be synchronized with a synchronizing signal said loop also including means coupled to said local oscillator for controlling the frequency of its output in accordance with a signal indicative of the phase relationship between the oscillations of said oscillator and the synchronizing signals, said system comprising: a sweep oscillator, means coupling the output of said sweep oscillator to said local oscillator control means so that the output of said sweep oscillator sweeps the output of the local oscillator through the frequency of said synchronizing signal, means for causing said sweep oscillator to produce an output only when said local oscillator output and said synchronizing signal are not in synchronism, and means connected to said sweep oscillator for slowing the speed of the sweep when the frequency of the local oscillator output initially approaches the frequency of the synchronizing signal.

9. The system of claim 8 wherein the means for slowing the speed of the sweep comprises: a phase detector for producing a beat signal output the frequency of which is equal to the frequency difference between said synchronizing signal and the output of said local oscillator, and a rectifier and low-pass filter arrangement for producing a D.-C. control signal from said beat signal when the frequency of said beat signal is below a predetermined value.

References Cited in the file of this patent

UNITED STATES PATENTS

| | | |
|---|---|---|
| 2,434,293 | Stearns | Jan. 13, 1948 |
| 2,434,294 | Ginzton | Jan. 13, 1948 |
| 2,492,018 | Sunstein | Dec. 20, 1949 |
| 2,541,454 | White et al. | Feb. 13, 1951 |
| 2,704,329 | Law | Mar. 15, 1955 |
| 2,705,756 | Strandberg | Apr. 5, 1955 |
| 2,725,476 | Hugenholtz | Nov. 29, 1955 |